US010411692B2

United States Patent
Suh et al.

(10) Patent No.: US 10,411,692 B2
(45) Date of Patent: Sep. 10, 2019

(54) ACTIVE CLAMP OVERVOLTAGE PROTECTION FOR SWITCHING POWER DEVICE

(71) Applicant: Alpha and Omega Semiconductor Incorporated, Sunnyvale, CA (US)

(72) Inventors: Bum-Seok Suh, Gyeonggi-Do (KR); Wonjin Cho, Gyeonggi-Do (KR); Son Tran, San Jose, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 338 days.

(21) Appl. No.: 15/360,590

(22) Filed: Nov. 23, 2016

(65) Prior Publication Data

US 2018/0145675 A1     May 24, 2018

(51) Int. Cl.
H03K 17/082     (2006.01)
H02H 9/04       (2006.01)
(Continued)

(52) U.S. Cl.
CPC ......... *H03K 17/0828* (2013.01); *H02H 9/044* (2013.01); *H02M 1/083* (2013.01);
(Continued)

(58) Field of Classification Search
CPC ............ H03K 17/0828; H03K 17/168; H03K 17/163; H02H 9/044; H02M 1/083; H02M 1/32; H02M 5/458; H05B 6/062
(Continued)

(56) References Cited

U.S. PATENT DOCUMENTS

| 4,890,185 A * | 12/1989 | Karl ..................... H02H 9/04 361/91.6 |
| 5,500,616 A | 3/1996 | Ochi |

(Continued)

FOREIGN PATENT DOCUMENTS

| CN | 103794585 A | 5/2014 |
| CN | 204906177 U | 12/2015 |

(Continued)

OTHER PUBLICATIONS

B. Rubino, C. Parisi and S. Buonomo, "Potential of new SLLIMM™—nano Intelligent Molded Module for low power home appliance motor drives," Power Electronics and Motion Control Conference (EPE/PEMC), 2012 15th International, Novi Sad, 2012, pp. LS6d.1-1-LS6d.1-7.

(Continued)

*Primary Examiner* — Zeev V Kitov
(74) *Attorney, Agent, or Firm* — Patent Law Works LLP

(57) ABSTRACT

A controller for driving a power switch incorporates a protection circuit to protect the power switch from fault conditions, such as over-voltage conditions or power surge events. The protection circuit includes a fault detection circuit and a protection gate drive circuit. The fault detection circuit is configured to monitor the voltage across the power switch and to generate a fault detection indicator signal and the protection gate drive circuit is configured to generate a gate drive signal to turn on the power switch in response to a detected fault condition. In particular, the protection gate drive circuit generates a gate drive signal that has a slow assertion transition and is clamped at a given gate voltage value. In this manner, the protection circuit implements active clamping of the gate terminal of the power switch and safe handling of the power switch during over-voltage events.

15 Claims, 6 Drawing Sheets

(51) Int. Cl.
*H02H 6/00* (2006.01)
*H05B 6/06* (2006.01)
*H02M 1/08* (2006.01)
*H02M 5/458* (2006.01)
*H02M 1/32* (2007.01)
*H03K 17/16* (2006.01)

(52) U.S. Cl.
CPC ............. *H02M 1/32* (2013.01); *H02M 5/458* (2013.01); *H03K 17/168* (2013.01); *H05B 6/062* (2013.01); *H03K 17/163* (2013.01)

(58) Field of Classification Search
USPC ........................................................ 361/91.1
See application file for complete search history.

(56) References Cited

U.S. PATENT DOCUMENTS

| | | | |
|---|---|---|---|
| 5,608,595 A * | 3/1997 | Gourab | H03K 17/0826 361/101 |
| 6,097,582 A * | 8/2000 | John | H03K 17/165 361/79 |
| 6,194,885 B1 | 2/2001 | Oshima | |
| 6,414,533 B1 | 7/2002 | Graves | |
| 7,902,604 B2 | 3/2011 | Su et al. | |
| 9,013,848 B2 | 4/2015 | Lui | |
| 2013/0127429 A1 | 5/2013 | Li | |
| 2014/0346522 A1 | 11/2014 | Disney et al. | |
| 2015/0346750 A1 | 12/2015 | Bhattad | |
| 2016/0099189 A1 | 4/2016 | Khai Yen et al. | |
| 2016/0105017 A1 | 4/2016 | Mallik et al. | |
| 2017/0122996 A1 | 5/2017 | Sullivan | |
| 2017/0302151 A1* | 10/2017 | Snook | H02M 1/08 |
| 2018/0020507 A1 | 1/2018 | Liu et al. | |
| 2018/0270913 A1 | 9/2018 | Bredemeier et al. | |

FOREIGN PATENT DOCUMENTS

| | | |
|---|---|---|
| CN | 205004739 U | 1/2016 |
| CN | 105489561 A | 4/2016 |
| CN | 105991005 A | 10/2016 |
| TW | 494628 B | 7/2002 |
| TW | 201334423 | 8/2013 |
| TW | I426596 B | 2/2014 |
| TW | 201440399 A | 10/2014 |
| TW | 201534028 A | 9/2015 |
| TW | I519068 B | 1/2016 |
| TW | 201624901 A | 7/2016 |
| TW | 201717354 A | 5/2017 |

OTHER PUBLICATIONS

G. Majumdar, K. H. Hussein, M. Iwasaki, H. Kawafuji, T. Iwagami and H. Yoshida, "Novel intelligent power modules for low-power inverters," Power Electronics Specialists Conference, 1998. PESC 98 Record. 29th Annual IEEE, Fukuoka, 1998, pp. 1173-1179 vol. 2.

J. Song J. Lee, D. Chung, B. Suh and F. Wolfgang, "A new intelligent power module with Reverse conducting IGBTs for up to 2.5kW motor drives," Power Electronics Conference (IPEC), 2010 International, Sapporo, 2010, pp. 156-158.

J. Song, J. Lee, D. Chung and F. Wolfgang, "The new intelligent power modules with Reverse conducting IGBTs and SOI driver for low power motor drives," Electrical Machines and Systems (ICEMS), 2010 International Conference on, Incheon, 2010, pp. 384-386.

K. Yoshida, M. Kudoh, S. Takeuchi, S. Furuhata and T. Fujihira, "A self-isolated intelligent IGBT for driving ignition coils," Power Semiconductor Devices and ICs, 1998. ISPSD 98. Proceedings of the 10th International Symposium on, Kyoto, 1998, pp. 105-108.

M. Honsberg, E. Thal, E. Stumpf and E. Wiesner, "A novel ultra compact surface mountable 1A/500V rated Intelligent Power Module (IPM) utilizing Silicon on Insulator (SOI) technology," 2007 International Aegean Conference on Electrical Machines and Power Electronics, Bodrum, 2007, pp. 47-51.

N. Clark, E. Motto and S. Shibata, "New SLIM Package Intelligent Power Modules (SLIMDIP) with thin RC-IGBT for consumer goods applications," 2015 IEEE Energy Conversion Congress and Exposition (ECCE), Montreal, QC, 2015, pp. 4510-4512.

S. Shim, B. Choo, J. Lee and D. Chung, "A new high efficient 2-phase and 3-phase interleaved Power Factor Correction boost converter typed Intelligent Power Module with high switching capability for low power home appliances," 2015 9th International Conference on Power Electronics and ECCE Asia (ICPE-ECCE Asia), Seoul, 2015, pp. 2324-2327.

A. Jain, R. Mallik, G. Catalisano and L. Abbatelli, "IGBT over voltage protection scheme in quasi resonant induction heating applications," 2015 Annual IEEE India Conference (INDICON), New Delhi, 2015, pp. 1-5.

G. Majumdar, T. Hiramoto, T. Shirasawa, T. Tanaka and K. Mochizuki, "Active surge voltage clamped 600 A IPM for high power application," Power Semiconductor Devices and ICs, 1995. ISPSD '95., Proceedings of the 7th International Symposium on, Yokohama, 1995, pp. 75-79.

L. Dulau, S. Pontarollo, A. Boimond, J. F. Garnier, N. Giraudo and O. Terrasse, "A new gate driver integrated circuit for IGBT devices with advanced protections," in IEEE Transactions on Power Electronics, vol. 21, No. 1, pp. 38-44, Jan. 2006.

M. E. Tulu and D. Yildirim, "Induction cooker design with quasi resonant topology using jitter drive method," Environment and Electrical Engineering (EEEIC), 2013 12th International Conference on, Wroclaw, 2013, pp. 1-6.

M. F. Alkayal and J. C. Crebier, "Integrated monolithic over-voltage protection circuit with adjustable threshold voltage," Industry Applications Conference, 2004. 39th IAS Annual Meeting. Conference Record of the 2004 IEEE, 2004, pp. 1903-1909 vol. 3.

O. Lucia, P. Maussion, E. J. Dede and J. M. Burdío, "Induction Heating Technology and Its Applications: Past Developments, Current Technology, and Future Challenges," in IEEE Transactions on Industrial Electronics, vol. 61, No. 5, pp. 2509-2520, May 2014.

T. Laska et al., "Short circuit properties of Trench-/Field-Stop-IGBTs-design aspects for a superior robustness," Power Semiconductor Devices and ICs, 2003. Proceedings. ISPSD '03. 2003 IEEE 15th International Symposium on, 2003, pp. 152-155.

V. Crisafulli and C. V. Pastore, "New control method to increase power regulation in a AC/AC quasi resonant converter for high efficiency induction cooker," 2012 3rd IEEE International Symposium on Power Electronics for Distributed Generation Systems (PEDG), Aalborg, 2012, pp. 628-635.

V. John, Bum-Seok Suh and T. A. Lipo, "High-performance active gate drive for high-power IGBT's," in IEEE Transactions on Industry Applications, vol. 35, No. 5, pp. 1108-1117, Sep./Oct. 1999.

V. John, Bum-Seok Suh and T. A. Lipo, "Fast-clamped short-circuit protection of IGBT's," in IEEE Transactions on Industry Applications, vol. 35, No. 2, pp. 477-486, Mar./Apr. 1999.

Z. Wang, X. Shi, L. M. Tolbert, F. Wang and B. J. Blalock, "A di/dt Feedback-Based Active Gate Driver for Smart Switching and Fast Overcurrent Protection of IGBT Modules," in IEEE Transactions on Power Electronics, vol. 29, No. 7, pp. 3720-3732, Jul. 2014.

* cited by examiner

… … … … … … …
ACTIVE CLAMP OVERVOLTAGE PROTECTION FOR SWITCHING POWER DEVICE

BACKGROUND OF THE INVENTION

Induction heating has been widely adopted in domestic, industrial and medical applications. Induction heating refers to the technique of heating an electrically conducting object (such as a metal) by electromagnetic induction whereby electric current is generated in a closed circuit (the object) by the fluctuation of current in another circuit placed physically close to the object. For example, an induction cooker includes a resonant tank driven by an alternating current to induce an alternating magnetic field at an induction coil. The alternating magnetic field at the induction coil induces current in a metal cooking pot placed physically near the induction coil. The current induced in the resistive metal cooking pot generates heat which in turn heats the food in the cooking pot.

A commonly used topology for induction heating applications is the single switch quasi-resonant inverter topology including a single power switch and a single resonant capacitor to supply variable resonant current to the induction coil. The single switch quasi-resonant inverter is often implemented using an insulated gate bipolar transistor (IGBT) as the power switching device due to the high power capability and high switching frequency operation of IGBTs.

Overvoltage conditions, such as a power surge, can be a serious problem for the single switch quasi-resonant inverter circuit. In particular, the power switching device in the quasi-resonant inverter circuit may fail or become permanently damaged when a voltage exceeding the voltage rating of the power switching device is applied. For example, an abnormally high surge voltage may be applied to the AC input line during a lightning event. In the event that the surge voltage exceeds the breakdown voltage of the power switching device, the power switching device may become irreversibly damaged if remedial action is not taken within a very short time from the power surge event, on the order of a few microseconds.

BRIEF DESCRIPTION OF THE DRAWINGS

Various embodiments of the invention are disclosed in the following detailed description and the accompanying drawings.

DETAILED DESCRIPTION

Figure 1:
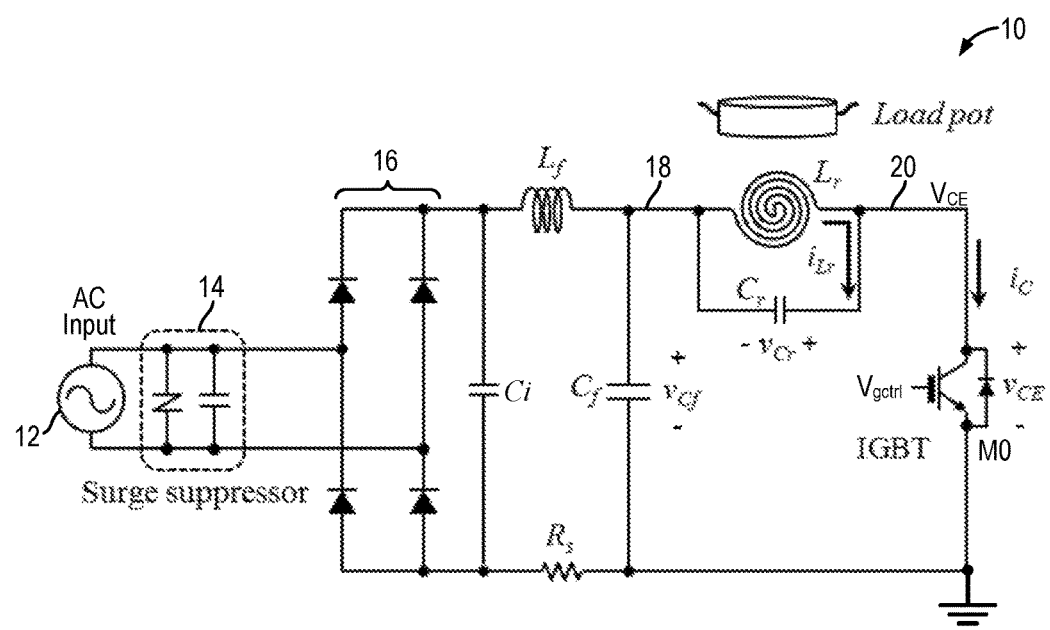
FIG. 1 is a circuit diagram of a single switch quasi-resonant inverter applied in an induction heating application in some examples.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a controller for driving a power switch incorporates a protection circuit to protect the power switch from fault conditions, such as over-voltage conditions or power surge events. The protection circuit includes a fault detection circuit and a protection gate drive circuit. The fault detection circuit is configured to monitor the voltage across the power switch and to generate a fault detection indicator signal and the protection gate drive circuit is configured to generate a gate drive signal to turn on the power switch in response to a detected fault condition. In particular, the protection gate drive circuit generates a gate drive signal that has a slow assertion transition and is clamped at a given gate voltage value. In this manner, the protection circuit implements active clamping of the gate terminal of the power switch and safe handling of the power switch during over-voltage events.

In some embodiments, the protection gate drive circuit drives the power switch to turn on for predetermined time duration to dissipate the energy from a fault over-voltage event across the power switch. In other embodiments, the fault detection circuit includes a hysteresis over-voltage detection circuit using a set voltage level and a reset voltage level for fault condition detection, the set voltage level being higher than the reset voltage level. The fault detection indicator signal is asserted when the voltage across the power switch exceeds the set voltage level and the fault detection indicator signal is deasserted when the voltage across the power switch drops below the reset voltage level. In some embodiments, the protection gate drive circuit asserts the gate drive signal to turn on the power switch at the clamped gate voltage in response to the fault detection indicator signal being asserted. The protection gate drive circuit applies the clamped gate drive signal until the fault detection indicator signal is deasserted or for a predetermined fixed time duration, whichever is shorter.

In embodiments of the present invention, the controller is applied to drive a power switch incorporated in a single switch quasi-resonant inverter for induction heating applications. The single switch quasi-resonant inverter is often implemented using an insulated gate bipolar transistor (IGBT) as the power switching device due to the high power capability and high switching frequency operation of the IGBTs. The protection circuit of the present invention implements an active gate drive protection scheme to protect a power switch and can be advantageously applied to protect the IGBT in a quasi-resonant inverter circuit used in induction heating applications.

The protection circuit of the present invention realizes advantages over conventional protection schemes for power switching devices or IGBTs. In particular, the protection circuit of the present invention implements active clamping with soft gate drive control to protect the power switching device during an over-voltage event. During an over-voltage event, the power switching device is turned on with the gate voltage clamped to protect the gate terminal of the power switching device from excessive voltages. Meanwhile, the power switching device is turned on one or more times successively to dissipate the excessive voltage and current. The soft gate drive control, including soft turn-on and soft-turn-off, dampens the oscillations that may be generated from the voltage transients across the power switching device during the on and off switching. The protection circuit of the present invention realizes effective over-voltage protection of power switching devices or IGBTs.

FIG. 1 is a circuit diagram of a single switch quasi-resonant inverter applied in an induction heating application in some examples. Referring to FIG. 1, a single switch quasi-resonant inverter 10 includes a surge suppressor 14, a bridge rectifier 16, a filter circuit, a resonant tank and a power switching device M0, also referred to as a power switch. The quasi-resonant inverter 10 receives an AC input voltage 12 which is coupled to the surge suppressor 14. The bridge rectifier 16, also referred to as a diode bridge, converts the AC input voltage 12 to a DC voltage which is then filtered by the filter circuit including an input capacitor $C_i$, a filter inductor $L_f$, a filter capacitor $C_f$ and a resistor $R_S$. The filtered DC voltage is applied to the resonant tank formed by an induction coil Lr and a resonant capacitor Cr. The induction coil Lr is connected to the power switch M0 which is switched on and off in response to a gate drive signal $V_{gctrl}$. When the power switch M0 is turned on, a current $i_C$ flow from the induction coil Lr through the power switch M0 to ground. When the power switch M0 is turned off, no current flow through the power switch M0. Instead, a current $i_{Lr}$ circulates between the induction coil Lr and the resonant capacitor Cr. In the present embodiment, the power switch M0 is an insulated gate bipolar transistor (IGBT). The collector terminal of the IGBT is connected to the induction coil Lr (node 20) and the emitter terminal of the IGBT is connected to ground. The gate terminal of the IGBT is driven by the gate drive signal $V_{gctrl}$.

In operation, when the power switch M0 (IGBT) is turned on, an alternating electric current flows through the induction coil Lr, which produces an oscillating magnetic field. The oscillating magnetic field induces an electric current into a metal cooking pot placed physically near the induction coil. The current flows in the resistive metal pot will generate heat, thereby heating the food in the cooking pot. When the power switch M0 is turned off, the current $i_{Lr}$ circulates around the induction coil Lr and the capacitor Cr. The power switch M0 is turned on and off in response to the gate drive signal $V_{gctrl}$ to control the amount of electric current induced in the cooking pot, there by controlling the amount of heat generated.

The power switch M0 (IGBT) is turned on and off during the operation of the single switch quasi-resonant inverter. The power switch M0 can experience high voltage transients at the power terminal (node 20) when the power switch is being turned off. For example, when the IGBT is switched off, the collector voltage $V_{CE}$ (node 20) can increase very fast, such as up to 800-1000V for an AC input voltage of 220V. In this case, an IGBT with a typical voltage rating of 1.7 kV for collector-emitter voltage can handle the normal voltage transients during on-off switching operation. However, the IGBT may be exposed to fault over-voltage conditions, such as a power surge event, where a voltage surge induces a voltage at the induction coil Lr that exceeds the voltage rating of the IGBT. For instance, during a lightning event, an abnormally large power surge may be introduced to the AC power line. A power surge event caused by lightning can drive the collector voltage of the IGBT to above 2 kV, beyond the voltage rating of the IGBT, resulting in damage to the IGBT. Therefore, the power switch or IGBT in the single switch quasi-resonant inverter needs to be protected from over-voltage events, such as an excessive power surge event.

Furthermore, the power switch needs to be protected from power surge events especially when the power surge event occurs when the power switch is turned off. When the power switch is turned on, the power switch can dissipate the surge voltage to ground by conduction through its power terminals. For example, when the IGBT is turned on, the IGBT can conduct the voltage surge from the collector to the emitter which is connected to ground to dissipate the voltage surge. However, if the IGBT is turned off, the transistor does not dissipate the surge voltage and the collector terminal may experience excessive surge voltage exceeding the voltage rating of the device, causing permanent damage to the transistor.

Figure 2:
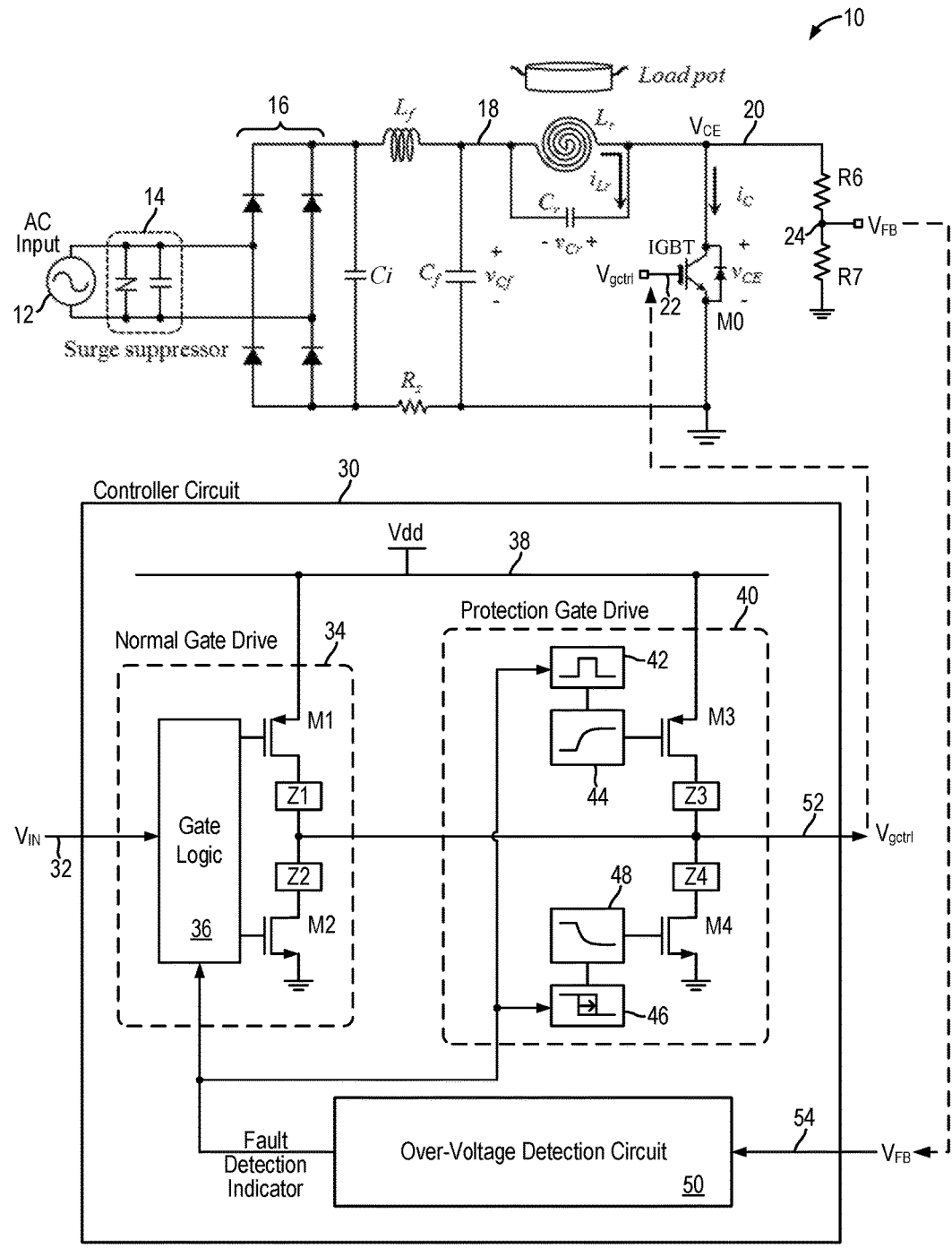
FIG. 2 is a block diagram of a controller circuit including a protection circuit coupled to drive the power switch in a single switch quasi-resonant inverter for induction heating application in embodiments of the present invention.

FIG. 2 is a block diagram of a controller circuit including a protection circuit coupled to drive the power switch in a single switch quasi-resonant inverter for induction heating application in embodiments of the present invention. Referring to FIG. 2, the single switch quasi-resonant inverter 10 of FIG. 1 is driven by a controller circuit 30 to switch the power switch M0 on and off to conduct current alternately through the induction coil Lr. In the present embodiment, the power switch M0 is an IGBT having a gate as the control terminal and collector and emitter terminals as the power terminals. In the following description, the controller circuit will be described as driving the IGBT as the power switch M0. The present description is illustrative only and not intended to be limiting. It is understood that the power switch M0 can be implemented using other power switching devices other than an IGBT. A power switch or a power switching device includes a control terminal or a gate terminal receiving a control signal or a gate drive signal and a pair of power terminals conducting currents.

In embodiments of the present invention, the controller circuit 30 includes a normal gate drive circuit 34 and a protection circuit formed by a protection gate drive circuit 40 and a fault detection circuit 50. In the present embodiment, the fault detection circuit 50 is constructed as an over-voltage detection circuit configured to detect an over-voltage condition or excessive voltage event at the collector terminal (node 20) of the IGBT or an excessive collector-to-emitter voltage $V_{CE}$ at the IGBT.

In controller circuit 30, the normal gate drive circuit 34 receives an input signal $V_{IN}$ (node 32) for controlling the on and off switch cycle of the power switch M0 or the IGBT to obtain the desired power output at the quasi-resonant inverter. The input signal $V_{IN}$ can be a PWM signal, or a clock signal switching between on period and off period.

The normal gate drive circuit 34 generates an output signal on node 52 as the gate drive signal $V_{gctrl}$ coupled to the gate terminal (node 22) of the IGBT. In the present embodiment, the normal gate drive circuit is constructed as a CMOS inverter and includes a PMOS transistor M1 connected in series with an NMOS transistor M2 between the positive power supply Vdd (node 38) and ground. An impedance Z1 is coupled to the drain terminal (node 52) of the PMOS transistor M1 and an impedance Z2 is coupled to the drain terminal (node 52) of the NMOS transistor M2. The common node 52 between the PMOS transistor M1 and the NMOS transistor M2 is the output signal of the normal gate drive circuit 34.

A gate logic circuit 36 receives the input signal $V_{IN}$ and generates gate control signals for the PMOS transistor M1 and the NMOS transistor M2. The gate logic circuit 36 generates gate control signals for the PMOS transistor M1 and the NMOS transistor M2 so that the PMOS transistor M1 and the NMOS transistor M2 are turned on and off alternately in response to the input signal $V_{IN}$. That is, the PMOS transistor M1 and the NMOS transistor M2 are not turned on at the same time. Accordingly, as the input signal $V_{IN}$ switches between a logical high level and a logical low level, the normal gate drive circuit 34 generates the gate drive signal $V_{gctrl}$ to cause the IGBT to switch on and off in normal operation. More specifically, the NMOS transistor M2 is turned on to drive the gate terminal of the IGBT to ground to turn off the IGBT in normal operation. Alternately, the PMOS transistor M1 is turned on to drive the gate terminal of the IGBT to power supply voltage Vdd to turn on the IGBT in normal operation.

The controller circuit 30 includes a protection circuit providing over-voltage protection for the power switch M0 or IGBT at the gate drive level. The protection circuit implements active gate clamping and safe handling of over-voltage events at the power switch of the quasi-resonant inverter. The protection circuit includes the over-voltage detection circuit 50 and the protection gate drive circuit 40. The over-voltage detection circuit 50 detects for over-voltage fault conditions during the normal operation of the power switch and activates remedial actions to protect the power switch from damage. The protection gate drive circuit 40 is activated in response to the detection of a fault condition to generate a clamped gate voltage as the gate drive signal to bias the power switch so as to dissipate the voltage surge before any damage is done to the power switch.

The over-voltage detection circuit 50 receives a feedback voltage $V_{FB}$ on an input node 54 indicative of the collector-to-emitter voltage $V_{CE}$ of the IGBT, or the voltage across the power terminals of the power switch M0. In the present embodiment, a voltage divider formed by resistors R6 and R7 is coupled to the collector terminal (node 20) of the IGBT to divide down the collector-to-emitter voltage as the feedback voltage $V_{FB}$. The feedback voltage $V_{FB}$ (node 24) is coupled to the over-voltage detection circuit 50 to detect for an over-voltage condition. In embodiments of the present invention, the over-voltage detection circuit 50 is operative only during the off-period of the IGBT. That is, the over-voltage detection circuit 50 is activated to monitor the collector-to-emitter voltage only during the time period when the IGBT is driven by the gate drive signal $V_{gctrl}$ to be fully turned off.

When the IGBT is fully turned on, the IGBT conducts current from the collector to the emitter and the collector voltage (node 20) is held at the saturation voltage $V_{CE-SAT}$ voltage. So even if there is a power surge, the collector voltage at the IGBT is low and the IGBT is protected from damage. However, during the period when the IGBT is fully turned off, a power surge at the collector terminal of the IGBT may result in a collector voltage that is too high and damage the IGBT.

During the off-period of the IGBT, the over-voltage detection circuit 50 compares the feedback voltage $V_{FB}$ (node 24) to an over-voltage threshold voltage value to determine if an over-voltage condition has occurred at the collector terminal of the IGBT. The over-voltage detection circuit 50 generates a fault detection indicator signal in the event that the feedback voltage $V_{FB}$ exceeds the over-voltage threshold voltage value. More specifically, the over-voltage detection circuit 50 asserts the fault detection indicator signal in response to the feedback voltage $V_{FB}$ exceeding the over-voltage threshold voltage value and deasserts the fault detection indicator signal in response to the feedback voltage $V_{FB}$ being below the over-voltage threshold voltage value. In some embodiments, the over-voltage detection circuit is constructed as a hysteresis over-voltage detection circuit including a set voltage level and a reset voltage level for fault over-voltage condition detection, the set voltage level being higher than the reset voltage level. The fault detection indicator signal is asserted when the feedback voltage exceeds the set voltage level and the fault detection indicator signal is deasserted when the feedback voltage drops below the reset voltage level.

The fault detection indicator signal, or a signal indicative thereof, is provided to the normal gate drive circuit 34 and to the protection gate drive circuit 40. At the normal gate drive circuit 34, the fault detection indicator signal, or its equivalent, is coupled to the gate logic circuit 36 and is operative to disable or turn off the NMOS transistor M2 when a fault over-voltage condition is detected. During the time period when the over-voltage detection circuit 50 is active, the IGBT is turned off, meaning that the NMOS transistor M2 in the normal gate drive circuit 34 is activated or turned on to drive the gate drive signal to ground, thereby turning off the IGBT. In order to initiates remedial measures in response to the detection of a fault over-voltage condition, the NMOS transistor M2 should be turned off or disabled so that the protection gate drive circuit 40 can be activated to drive the gate of the IGBT. In this manner, the protection gate drive circuit 40 does not have to over-drive the NMOS transistor M2. In other words, in normal operation, transistors M1 and M2 are alternately turned on and off to drive the gate of the IGBT. However, when an over-voltage condition is detected, both transistors M1 and M2 are turned off prior to or at the same time as remediation measures are being initiated at the protection gate drive circuit 40.

The fault detection indicator signal, or a signal indicative thereof, is also provided to protection gate drive circuit 40 to initiate remedial measures to protect the IGBT. In the present embodiment, the protection gate drive circuit 40 includes a PMOS transistor M3 connected in series with an NMOS transistor M4 between the positive power supply Vdd (node 38) and ground. An impedance Z3 is provided at the drain terminal (node 52) of the PMOS transistor M3 and an impedance Z4 is provided at the drain terminal (node 52) of the NMOS transistor M4. The common node 52 between the PMOS transistor M3 and the NMOS transistor M4 is the output signal of the protection gate drive circuit. The protection gate drive circuit 40 generates an output signal on node 52 as the gate drive signal $V_{gctrl}$ coupled to the gate terminal (node 22) of the IGBT.

The fault detection indicator signal, or a signal indicative thereof, generated by the over-voltage detection circuit 50 is coupled to control the PMOS transistor M3 and the NMOS transistor M4 through respective time controllers and gate voltage clamping circuits. At PMOS transistor M3, the fault detection indicator signal, or a signal indicative thereof, is coupled to a time controller 42 and a gate control circuit 44. The time controller 42 controls the on-duration of PMOS transistor M3 in response to the fault detection indicator signal. In particular, the time controller 42 causes the PMOS transistor M3 to be turned on until the fault detection indicator signal is deasserted or for a predetermined fixed time duration (also called "one shot duration"), whichever is shorter. At NMOS transistor M4, the fault detection indicator signal is coupled to a time controller 46 and a gate control circuit 48. The time controller 46 controls the on-duration of NMOS transistor M4 in response to the fault detection indicator signal. In particular, the time controller 46 delays the off assertion time of the NMOS transistor M4 to provide a soft turn-off of the IGBT, as will be explained in more detail below.

In operation, responsive to the fault detection indicator signal being asserted, the NMOS transistor M2 in the normal gate drive circuit 34 is turned off. Meanwhile, the protection gate drive circuit 40 turns on both the PMOS transistor M3 and the NMOS transistor M4. With both PMOS transistor M3 and the NMOS transistor M4 being turned on, the impedance Z3 and impedance Z4 form a voltage divider between the positive power supply voltage and ground. The voltage divider of Z3 and Z4 generates an output signal as the gate drive signal on output node 52 being a divided down voltage of the positive power supply voltage Vdd. In particular, the gate drive signal is clamped at a voltage value being a function of the impedances Z3 and Z4 and given as:

$$\text{Clamped Voltage} = \frac{Z4 + M4(rdson)}{(Z4 + M4(rdson)) + (Z3 + M3(rdson))} \times Vdd.$$

Accordingly, the protection gate drive circuit 40 generates an output signal at a clamped gate voltage value as the gate drive signal $V_{gctrl}$ to drive the gate terminal of the IGBT. The IGBT is therefore turned on during an over-voltage event to dissipate the excessive charge at the collector terminal (node 20). By driving the gate of the IGBT through a voltage divider of Z3 and Z4, the gate of the IGBT is turned on gradually, achieving soft turn-on for the clamped gate voltage. In this manner, the protection gate drive circuit 40 turns on the IGBT in a protection mode to discharge the voltage surge.

The over-voltage detection circuit 50 continues to monitor the feedback voltage $V_{FB}$. When the collector-to-emitter voltage $V_{CE}$ (node 20) drops below the over-voltage threshold voltage value, or the reset voltage level in a hysteresis detection circuit, the over-voltage detection circuit 50 deasserts the fault detection indicator signal. The protection gate drive circuit 40 can then be deactivated to turn off the IGBT in the protection mode. In operation, the time controller 42 will deassert the gate control signal to PMOS transistor M3 first to release the clamped gate voltage at the output node 52. In embodiments of the present invention, the protection circuit applies the clamped gate drive signal to turn the IGBT on during an over-voltage event but the on-duration of the IGBT is limited to a maximum duration determined by a fixed time duration. In cases where the voltage surge does not get dissipated with the IGBT being turned on at the clamped gate voltage, the fault detection indicator signal may remain asserted for an extended duration which is undesirable. It is not desirable to keep the IGBT turned on for too long as it may impact the reliability of the IGBT. Accordingly, the time controller 42 in the protection gate drive circuit 40 applies a maximum one-shot duration to the on-time of PMOS transistor M3. The time controller 42 deasserts the gate control signal to PMOS transistor M3 when the fault detection indicator signal being deasserted or when the fixed time duration has expired, whichever is sooner.

With the PMOS transistor M3 being disabled, the output signal of the protection gate drive circuit 40 is no longer driven to the clamped gate voltage. However, the gate terminal (node 22) of the IGBT needs to be discharged to ground in order to turn off the IGBT. Accordingly, when the fault detection indicator signal is deasserted, time controller 46 delays the deassertion of the gate drive signal to NMOS transistor M4. Therefore, when the over-voltage protection event has passed and the PMOS transistor M3 has been turned off, the NMOS transistor M4 remains turned on for a given delay time to discharge the gate terminal (node 22) of the IGBT, thereby achieving soft turn-off of the clamped gate voltage. After the delay duration, the NMOS transistor M4 is turned off and the NMOS transistor M2 in the normal gate drive circuit 34 is turned back on to hold the gate terminal of the IGBT to ground before the IGBT returns to normal operation.

As thus configured, the protection circuit implemented in the controller circuit 30 realizes gate drive level over-protection for the IGBT in the quasi-resonant inverter 10. In particular, by using the voltage divider of Z3 and Z4, the gate voltage of the IGBT is precisely controlled between the threshold $V_{GE\_th}$ and the Miller plateau level. Thus, the IGBT is turned on to enable the induction coil current $i_{Lr}$ to flow through the IGBT and the resonant capacitor voltage $V_{Cr}$ to be clamped at the desired level when the fault overvoltage condition occurs. In this manner, the protection circuit uses active gate drive to safely protect the IGBT or the power switch in the quasi-resonant inverter from voltage surge or other over-voltage events. The protection circuit implements soft turn on and turn-off operations to switch the IGBT without large transients. In some embodiments, the protection gate drive circuit is constructed using impedances Z3 and Z4 that ensures the clamped gate voltage to be independent of temperature variation.

Figure 3:
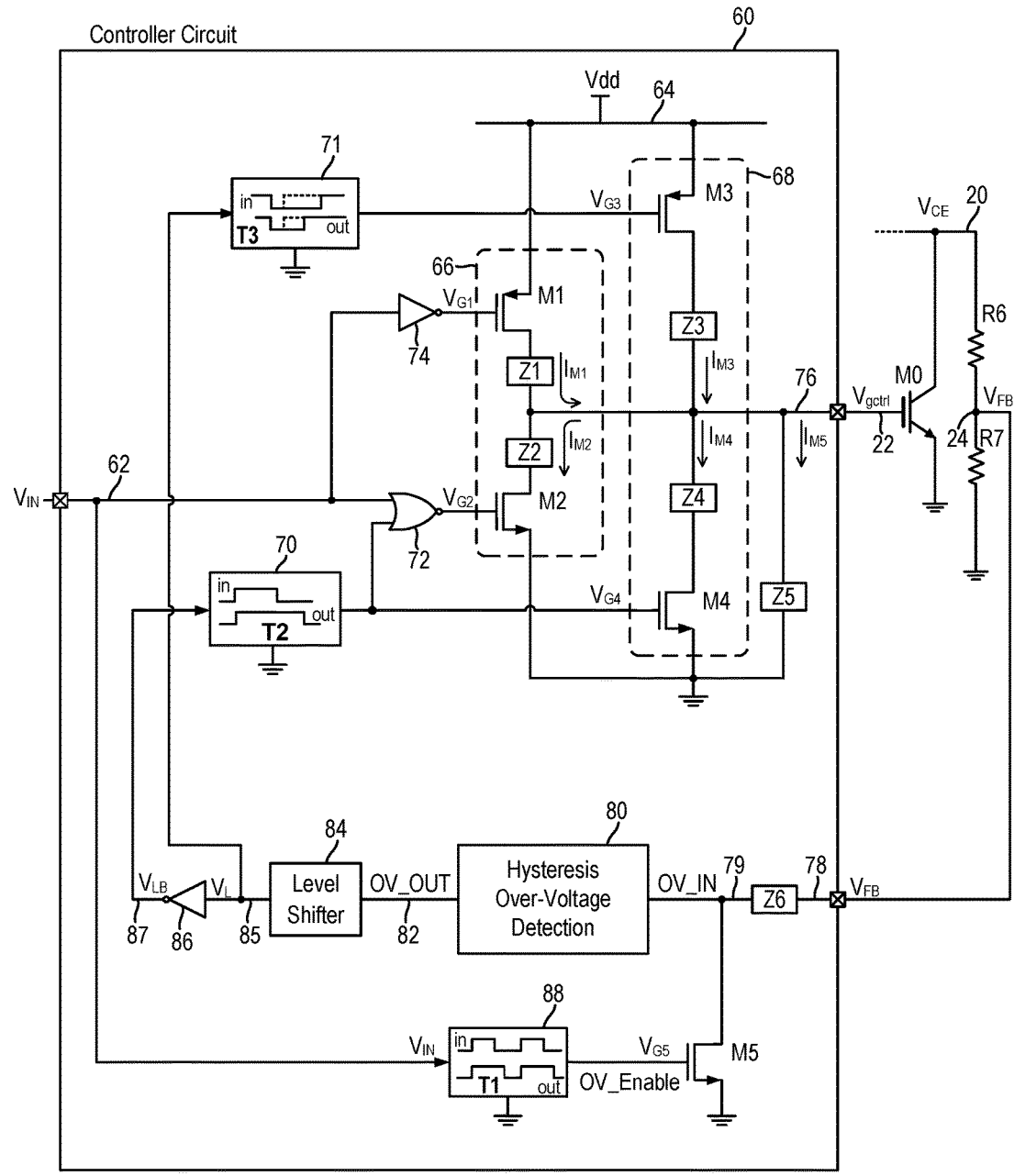
FIG. 3 is a circuit diagram illustrating the construction of the controller circuit of FIG. 2 in embodiments of the present invention.

FIG. 3 is a circuit diagram illustrating the construction of the controller circuit of FIG. 2 in embodiments of the present invention. Referring to FIG. 3, a controller circuit 60 for driving the gate terminal (node 22) of an IGBT includes a normal gate drive circuit 66 and a protection gate drive circuit 68. The controller circuit 60 also includes a hysteresis over-voltage detection circuit 80 configured to detect an over-voltage condition or excessive voltage event at the collector terminal (node 20) of the IGBT or an excessive collector-to-emitter voltage $V_{CE}$ at the IGBT.

In controller circuit 60, the normal gate drive circuit 66 receives an input signal $V_{IN}$ (node 62) for controlling the on and off switch cycle of the IGBT to obtain the desired power output at the quasi-resonant inverter. The normal gate drive circuit is constructed as a CMOS inverter and includes a PMOS transistor M1 connected in series with an NMOS transistor M2 between the positive power supply Vdd (node 64) and ground. An impedance Z1 is coupled to the drain terminal (node 76) of the PMOS transistor M1 and an impedance Z2 is coupled to the drain terminal (node 76) of the NMOS transistor M2. The common node 76 between the PMOS transistor M1 and the NMOS transistor M2 is the output signal of the normal gate drive circuit 34. The input signal $V_{IN}$ can be a PWM signal, or a clock signal switching between on period and off period. The normal gate drive circuit 66 generates an output signal on node 76 as the gate drive signal $V_{gctrl}$ coupled to the gate terminal (node 22) of the IGBT. In some embodiments, an impedance Z5 may be coupled to the output node 76 to keep the gate of the IGBT grounded should the gate is not driven by any other circuitry. The impedance Z5 is optional and may be omitted in other embodiments.

The input voltage $V_{IN}$ is coupled to an NOR gate 72 generating a gate control signal $V_{G2}$ for controlling the NMOS transistor M2. The input voltage $V_{IN}$ is further coupled to an inverter 74 generating a gate control signal $V_{G1}$ for controlling the PMOS transistor M1. The PMOS transistor M1 and the NMOS transistor M2 essentially function as a CMOS inverter for inverting the logical states of the input voltage $V_{IN}$ to drive the gate terminals of transistors M1 and M2. Thus, when the input voltage $V_{IN}$ is at a logical high, the PMOS transistor M1 is turned on and the NMOS transistor M2 is turned off. Meanwhile, when the input voltage $V_{IN}$ is at a logical low, the PMOS transistor M1 is turned off and the NMOS transistor M2 is turned on. NMOS transistor M2 is further controlled by a gate control signal $V_{G4}$ generated by a time controller 70. The input voltage $V_{IN}$ and the gate control signal $V_{G4}$ are coupled to the NOR gate 72. Therefore, the gate control signal $V_{G2}$ will assert (logical high) only when both the input voltage $V_{IN}$ and the gate control signal $V_{G4}$ are at a logical low. Otherwise, the gate control signal $V_{G2}$ is deasserted (logical low). The gate control signal $V_{G4}$ is generated from the fault detection indicator signal, as will be described in more details below.

The hysteresis over-voltage detection circuit 80 receives a feedback voltage $V_{FB}$ on an input node 78 indicative of the collector-to-emitter voltage $V_{CE}$ of the IGBT. In the present embodiment, a voltage divider formed by resistors R6 and R7 is coupled to the collector terminal (node 20) of the IGBT to divide down the collector-to-emitter voltage as the feedback voltage $V_{FB}$. The feedback voltage $V_{FB}$ (node 24) is coupled to the hysteresis over-voltage detection circuit 80 through an input impedance Z6 as the over-voltage monitor signal OV_IN to detect for an over-voltage condition. The input impedance Z6 functions as an analog filter for the feedback voltage and also provides the ESD protection for the NMOS transistor M5. In embodiments of the present invention, the hysteresis over-voltage detection circuit 80 is operative only during the off-period of the IGBT. Accordingly, the NMOS transistor M5 is coupled to the input node 79 to enable or disable the over-voltage monitor signal OV_IN in response to the input voltage $V_{IN}$. More specifically, the input voltage $V_{IN}$ is coupled to a timer controller 88. The timer controller 88 receives the input voltage signal $V_{IN}$ and generates an output signal OV_Enable being the input voltage with an extended on-period T1. The OV_Enable signal is the gate control signal $V_{G5}$ coupled to drive the gate terminal of NMOS transistor M5. NMOS transistor M5 is therefore turned on when the input voltage is asserted to turn on the IGBT. With NMOS transistor M5 turned on, the input node 79 is shorted to ground and therefore the over-voltage monitor signal OV_IN is disabled. The time controller 88 extends the on-time of the input voltage signal so as to mask the high-to-low transition of the input voltage $V_{IN}$ from the detection operation. That is, the NMOS transistor M5 remains turned on for a short duration after the falling edge of the input voltage VIN. In other words, the over-voltage monitor signal OV_IN is enabled a short duration after the input voltage $V_{IN}$ is deasserted, therefore masking the transition time from the detection operation. In this manner, the hysteresis over-voltage detection circuit 80 is activated to monitor the collector-to-emitter voltage $V_{CE}$ of the IGBT only during the time period when the IGBT is driven by the gate drive signal $V_{gctrl}$ to be fully turned off.

In some embodiments, the hysteresis over-voltage detection circuit 80 is constructed using a hysteresis band fast response and high gain comparator using a bandgap reference voltage. The hysteresis over-voltage detection circuit 80 is able to provide precise detection of over-voltage conditions by monitoring of the feedback voltage.

At the hysteresis over-voltage detection circuit 80, the over-voltage monitor signal OV_IN is compared to over-voltage threshold voltage values to determine if an over-voltage condition has occurred at the collector terminal of the IGBT. In particular, the hysteresis over-voltage detection circuit including a set voltage level and a reset voltage level for fault over-voltage condition detection, the set voltage level being higher than the reset voltage level. The over-voltage monitor signal OV_IN is compared to the set voltage level and the reset voltage level as the threshold voltage values. The hysteresis over-voltage detection circuit 80 generates a fault detection indicator signal OV_OUT (node 82). The fault detection indicator signal OV_OUT is asserted when the over-voltage monitor signal OV_IN exceeds the set voltage level and the fault detection indicator signal is deasserted when the over-voltage monitor signal OV_IN drops below the reset voltage level.

The fault detection indicator signal OV_OUT (node 82) is coupled to a level shifter 84 to adjust the voltage level of the indicator signal. The level-adjusted fault detection indicator signal $V_L$ (node 85) is coupled to an inverter 86 to generate an inverted indicator signal $V_{LB}$ (node 87). The level-adjusted fault detection indicator signal $V_L$ and inverted indicator signal $V_{LB}$ are coupled to drive the normal gate drive circuit 66 and the protection gate drive circuit 68. In the present embodiment, the fault detection indicator signal OV_OUT is an active low signal. That is, the fault detection indicator signal OV_OUT is normally at a logical high level (deasserted) and when a fault over-voltage condition is detected, the fault detection indicator signal OV_OUT transitions to a logical low level (asserted).

The protection gate drive circuit 68 includes a PMOS transistor M3 connected in series with an NMOS transistor M4 between the positive power supply Vdd (node 64) and ground. An impedance Z3 is provided at the drain terminal (node 76) of the PMOS transistor M3 and an impedance Z4 is provided at the drain terminal (node 76) of the NMOS transistor M4. The common node 76 between the PMOS transistor M3 and the NMOS transistor M4 is the output signal of the protection gate drive circuit. The protection gate drive circuit 68 generates an output signal on node 76 as the gate drive signal $V_{gctrl}$ coupled to the gate terminal (node 22) of the IGBT.

The fault detection indicator signal, or a signal indicative thereof, generated by the hysteresis over-voltage detection circuit 80 is coupled to the normal gate drive circuit 66 and to the protection gate drive circuit 68 to initiate remediation measures in response to detection of an over-voltage event. First, the inverted fault detection indicator signal $V_{LB}$ is coupled to the time controller 70. The inverted fault detection indicator signal $V_{LB}$ is at a logical low level when deasserted and at a logical high level when asserted. The time controller 70 passes the inverted fault detection indicator signal $V_{LB}$ to the output but with extended on duration T2. That is, the time controller 70 asserts the gate control signal $V_{G4}$ in response to the inverted fault detection indicator signal $V_{LB}$ being asserted and the time controller 70 deasserts the gate control signal $V_{G4}$ a given delay time after the inverted fault detection indicator signal $V_{LB}$ is deasserted. The gate control signal $V_{G4}$ is coupled to the NOR gate 72 whose output drives the NMOS transistor M2 in the normal gate drive circuit 66 and is also coupled to drive the NMOS transistor M4 in the protection gate drive circuit 68.

As described above, the hysteresis over-voltage detection circuit 80 is operative only during the off-period of the IGBT. In that case, the input voltage $V_{IN}$ is deasserted (logical low) and the gate control signal $V_{G2}$ is at a logical high level to drive the NMOS transistor M2 to a fully on-state. With NMOS transistor M2 fully turned on and the PMOS transistor M1 fully turned off, the gate terminal (node 22) of the IGBT is discharged to ground and is held at ground during the off-period. In response to the detection of an over-voltage event, the inverted fault detection indicator signal $V_{LB}$ is asserted (logical high) and the gate control signal $V_{G4}$ is asserted (logical high) as well. Therefore, the gate control signal $V_{G2}$ coupled to drive the NMOS transistor M2 transitions to a logical low level and the NMOS transistor M2 is disabled or turned off. Thus, the normal gate drive circuit 66 is disabled and is no longer driving the IGBT. Meanwhile, the gate control signal $V_{G4}$, being asserted, is also coupled to the gate terminal of the NMOS transistor M4 to turn the NMOS transistor M4 on.

Second, the fault detection indicator signal $V_L$ is coupled to the time controller 71. The fault detection indicator signal $V_L$ is at a logical high level when deasserted and at a logical low level when asserted. The time controller 71 passes the fault detection indicator signal $V_L$ to the output with an one-shot duration control. That is, the time controller 71 asserts (logical low) the gate control signal $V_{G3}$ in response to the fault detection indicator signal $V_L$ being asserted and the time controller 71 deasserts the gate control signal $V_{G3}$ in response to the fault detection indicator signal $V_L$ being deasserted or the expiration of a fixed time duration T3, whichever occurs first. Therefore, the maximum time duration the gate control signal $V_{G3}$ will be asserted is the fixed time duration, also referred to as the one-shot duration. The gate control signal $V_{G3}$ will be asserted for the one-shot duration or shorter. The gate control signal $V_{G3}$ is coupled to drive the gate terminal of the PMOS transistor M3 in the protection gate drive circuit 68.

In response to the detection of an over-voltage event, the fault detection indicator signal $V_L$ is asserted (logical low) and the gate control signal $V_{G3}$ is asserted (logical low) as well. The gate control signal $V_{G3}$ is coupled to the gate terminal of the PMOS transistor M3 to turn the PMOS transistor M3 on in response to the detection of the over-voltage event. The PMOS transistor M3 is turned on until the fault detection indicator signal $V_L$ is deasserted or the one-shot duration T3 has expired.

In operation, responsive to the fault detection indicator signal OV_OUT being asserted, the NMOS transistor M2 in the normal gate drive circuit 66 is turned off. Meanwhile, the protection gate drive circuit 68 turns on both the PMOS transistor M3 and the NMOS transistor M4. With both PMOS transistor M3 and the NMOS transistor M4 being turned on, the impedance Z3 and impedance Z4 form a voltage divider between the positive power supply voltage and ground. The voltage divider of Z3 and Z4 generates an output signal as the gate drive signal on output node 76 being a divided down voltage of the positive power supply voltage Vdd. In particular, the gate drive signal is clamped at a voltage value being a function of the impedances Z3 and Z4 and given as $(Z4/(Z3+Z4))*Vdd$. Accordingly, the protection gate drive circuit 68 generates an output signal at a clamped gate voltage value as the gate drive signal $V_{gctrl}$ to drive the gate terminal of the IGBT. The IGBT is therefore turned on during an over-voltage event to dissipate the excessive charge at the collector terminal (node 20). It is imperative to note that by driving the gate of the IGBT through a voltage divider of Z3 and Z4, the gate of the IGBT is turned on gradually, achieving soft turn-on control. In this manner, the protection gate drive circuit 68 turns on the IGBT in a protection mode to discharge the voltage surge.

In some embodiments, the ratio of the impedances Z3 and Z4 is 0.55. The clamped gate voltage applied to the IGBT is therefore about half of the power supply voltage Vdd. Furthermore, the protection circuit is capable of activating the protection gate drive circuit 68 very quickly to clamp the gate voltage of the IGBT. In one example, the peak of a power surge at the AC input may take about 15 μs to arrive at the collector terminal of the IGBT in the quasi-resonant inverter circuit. However, the protection circuit of the present invention is able to clamp the gate voltage of the IGBT at around 500 ns—long before the peak of the power surge arrives at the collector terminal. In this manner, the IGBT is turned on when the peak surge voltage reaches the collector terminal and the IGBT is able to dissipate the power surge safely, without damaging the IGBT.

The hysteresis over-voltage detection circuit 80 continues to monitor the feedback voltage $V_{FB}$. When the collector-to-emitter voltage $V_{CE}$ (node 20) drops below the reset voltage level, the over-voltage detection circuit 80 deasserts the fault detection indicator signal OV_OUT. The protection gate drive circuit 68 can then be deactivated to turn off the IGBT in the protection mode. In operation, the time controller 71 deasserts the gate control signal $V_{G3}$ to PMOS transistor M3 when the fault detection indicator signal $V_L$ is deasserted (logical high), or when the fixed time duration has expired, whichever is sooner. The clamped gate voltage at the output node 76 is therefore released. Meanwhile, the time controller 70 deasserts the gate control signal $V_{G4}$ a delayed time duration T2 after the inverted fault detection indicator signal $V_{LB}$ is deasserted (logical low). The NMOS transistor M4 is kept on after the PMOS transistor M3 is turned off in order to discharge the gate terminal (node 22) of the IGBT to turn off the IGBT. After the delay duration T2, the NMOS transistor M4 is turned off and the NMOS transistor M2 in the normal gate drive circuit 34 is turned back on to hold the gate terminal of the IGBT to ground before the IGBT returns to normal operation.

In embodiments of the present invention, the protection circuit of the present invention generates the clamped gate voltage for the gate drive signal (node 22) that is precisely controlled and without the voltage overshoot issues typically associated with conventional Zener-diode clamping method. Furthermore, the clamped gate voltage can be precisely controlled over temperature and fabrication process variations. In some embodiments, the impedances Z3 and Z4 are implemented using polysilicon resistors.

Figure 4:
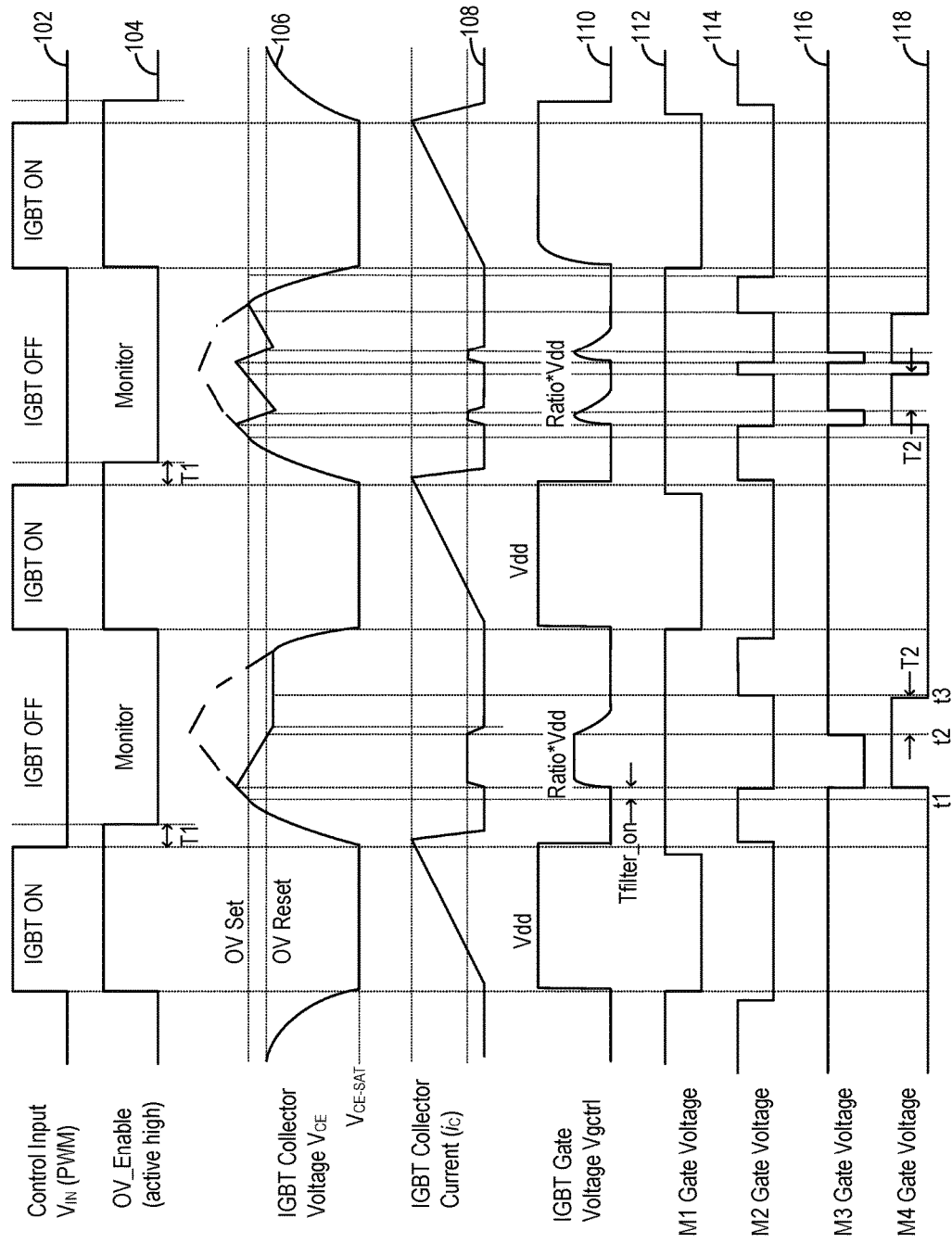
FIG. 4 is a timing diagram illustrating the operation of the controller circuit of FIG. 3 in some examples.

FIG. 4 is a timing diagram illustrating the operation of the controller circuit of FIG. 3 in some examples. Referring to FIG. 4, the input signal $V_{IN}$ (curve 102) is a PWM signal to turn the IGBT on and off to conduct current alternately through the induction coil. The time controller 88 generates the gate control signal OV_Enable (104) to drive the NMOS transistor M5 to enable or disable the over-voltage monitoring. In particular, the OV_Enable signal is extended by a duration T1 beyond the deassertion of the input signal $V_{IN}$ to mask the high-to-low transition of the input signal from the over-voltage monitoring. In normal operation, the gate voltage $V_{gctrl}$ of the IGBT (curve 110) switches between ground and the power supply voltage Vdd to turn the IGBT on and off. Meanwhile, the collector current $i_C$ (curve 108) increases linearly during the on-period of the IGBT and then decreases to zero during the off-period of the IGBT. In normal operation, the gate control signals for transistors M1 and M2 (curves 112 and 114) have a logical low levels during the on-period and have a logical high levels during the off-period of the IGBT. In normal operation, the gate control signal for transistor M3 (curve 116) is at a logical high level while the gate control signal for the transistor M4 (curve 118) is at a logical low level to disable the protection gate drive circuit.

During the on-period of the IGBT, the collector-to-emitter voltage $V_{CE}$ (curve 106) is driven to the collector-emitter saturation voltage $V_{CE\text{-}SAT}$. However, when the IGBT is turned off, the collector voltage can increase to a large voltage value, such as 600V. The IGBT typically has a voltage rating of 1.7 kV and can withstand the normal collector voltage excursion during the normal operation of the IGBT.

The hysteresis over-voltage detection circuit monitors the college voltage $V_{CE}$ of the IGBT during the off period of the IGBT and after the delay period T1 which masks the on-to-off transition of the input voltage $V_{IN}$. At time t1, certain power surge event causes the collector voltage $V_{CE}$ to exceed the set voltage level of the hysteresis over-voltage detection circuit. In one example, the set voltage level corresponds to about 1.4 kV of collector voltage. The hysteresis over-voltage detection circuit asserts the fault detection indicator signal. Within a very short time, such as by time t1, remediation measure is initiated. The gate control signal for transistor M2 is disabled (logical low) to turn off transistor M2. The gate control signal for transistor M3 is enabled (logical low) to turn on transistor M3 while the gate control signal for transistor M4 is enabled (logical high) to turn on transistor M4. As a result of transistors M3 and M4 being turned on, the gate voltage of the IGBT rises to the clamped gate voltage value defined by the Z3/Z4 voltage divider. The IGBT is turned on by the clamped gate voltage to conduct collector current is to dissipate the power surge. As a result, the collector voltage $V_{CE}$ decrease.

At time t2, the collector voltage $V_{CE}$ decreases below the reset voltage level of the hysteresis over-voltage detection circuit. In one example, the reset voltage level corresponds to about 1.2 kV of collector voltage. The hysteresis over-voltage detection circuit deasserts the fault detection indicator signal and transistor M3 is deasserted (logical high). Transistor M4 is kept on for the extended duration of T2 to discharge the gate voltage of the IGBT. At time t3, at the expiration of the duration T2, transistor M4 is turned off and transistor M2 is turned on to resume the normal operation.

The IGBT may then be turned on again for the normal operation. During the next off-period, the IGBT may experience additional power surge events. In this case, the transistors M3 and M4 are turned on again to dissipate the surge voltage. In the present example, within a single off-period, the surge voltage on the collector of the IGBT may cause the collector voltage to switch between the set voltage level and the reset voltage level multiple times. Each time the collector voltage exceeds the set voltage level, the protection gate drive circuit is enabled and each time the collector voltage drops below the reset voltage level, the protection gate drive circuit is disabled. In this manner, the protection gate drive circuit may be enabled multiple times within a single off-period to discharge the power surge.

Figure 5:
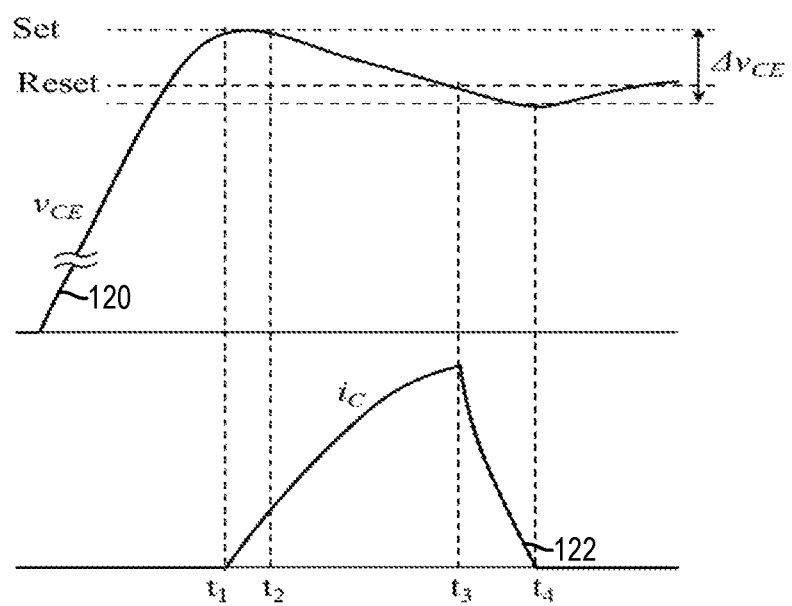
FIG. 5 illustrates the collector voltage and the collector current of the IGBT during a power surge event in some examples.

FIG. 5 illustrates the collector voltage and the collector current of the IGBT during a power surge event in some examples. Referring first to FIG. 2, the purpose of the protection circuit is to make the energy induced in the induction coil Lr to be consumed in the IGBT and to clamp the capacitor voltage Cr so that the collector voltage $V_{CE}$ does not increase over the IGBT voltage rating. Now turning to FIG. 5, the collector voltage $V_{CE}$ of the IGBT (curve 120) and the corresponding collector current $i_C$ (curve 122) are shown with the corresponding set and reset voltage levels used in the hysteresis over-voltage detection circuit. Note that the set and reset voltage levels shown in FIG. 5 are the corresponding voltage levels used in the hysteresis over-voltage detection circuit. The hysteresis over-voltage detection circuit receives a stepped down collector voltage for detection and the set and reset voltage levels used in the detection circuit are therefore corresponding stepped down voltage levels.

At time t1, a power surge appears at the collector terminal of the IGBT and the collector voltage increases to the set voltage level. The protection gate drive circuit is activated to turn on the IGBT at the clamped voltage level. The collector current $i_C$ begins to increase gradually with the clamped gate voltage being applied to the IGBT. The current flow direction of the coil current $i_{Lr}$ changes direction. Instead of circulating between the induction coil Lr and the capacitor Cr, the coil current $i_{Lr}$ flows towards the IGBT to be dissipated by the IGBT to ground. The collector voltage $V_{CE}$ is therefore clamped and do not increase further. When current $i_C$ becomes equal to current $i_{Lr}$ at time t2, the voltage $V_{CE}$ begins to fall by the discharge of capacitor Cr and the voltage decrease slope is decided by the collector current $i_C$ and the capacitance value of capacitor Cr. Once the voltage $V_{CE}$ reaches the reset level at time t3, the protection gate drive circuit is disabled and the collector current $i_C$ is turned off by a soft gate control to obtain a safe shutdown. The current falling time interval (t3-t4) makes the voltage $V_{CE}$ drop a little more below the reset level. Once the protection interval is completed at time t4, the IGBT returns to normal operation.

Figure 6:
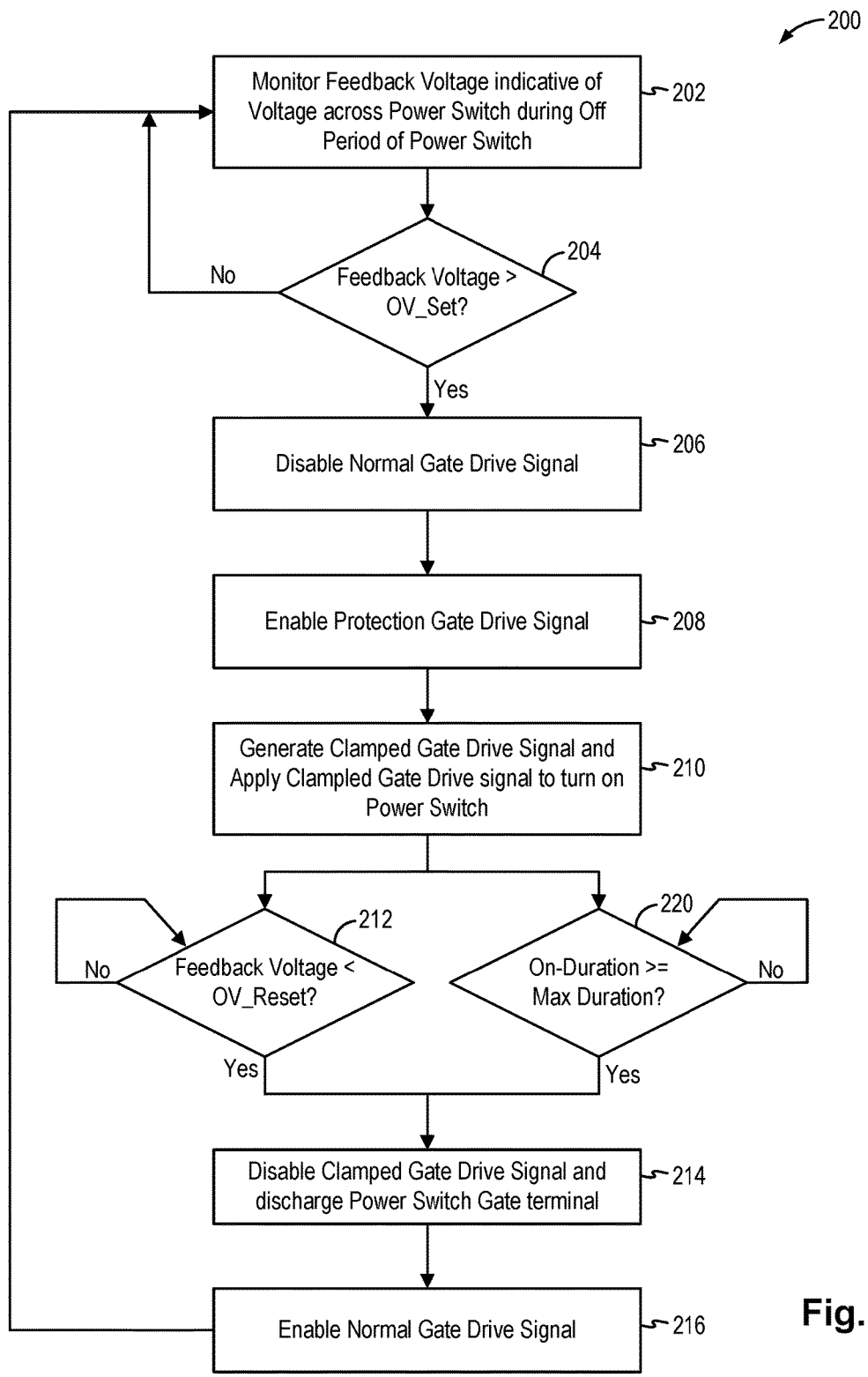
FIG. 6 is a flowchart illustrating a method for providing overvoltage or short-circuit protection for the power switching device in a quasi-resonant inverter circuit in embodiments of the present invention.

FIG. 6 is a flowchart illustrating a method for providing overvoltage or short-circuit protection for the power switching device in a quasi-resonant inverter circuit in embodiments of the present invention. Referring to FIG. 6, an over-voltage protection method 200 monitors a feedback voltage indicative of the voltage across the power switch during an off-period of the power switch (202). The feedback voltage is compared against an over-voltage set level OV_Set (204). In response to the feedback voltage being less than the OV_Set level, the method continues to monitor the feedback voltage indicative of the voltage across the power switch. On the other hand, in response to the feedback voltage being greater than the OV_Set level, the method 200 disables the normal gate drive signal (206). For example, the method 200 turns off the NMOS transistor M2 in the normal gate drive circuit that is driving the power switch to be in the off state. Then, the method 200 enables the protection gate drive signal (208). For example, the PMOS transistor M3 and the NMOS transistor M4 in the protection gate drive circuit are both turned on to form a voltage divider with impedances Z3 and Z4. The method 200 thus generates a clamped gate drive signal with a clamped gate voltage value (210). The clamped gate drive signal is applied to turn on the power switch. With the power switch turned on by the clamped gate drive signal, the method 200 monitors the feedback voltage to determine if the feedback voltage has decreased below a reset voltage level OV_Reset (212). The reset voltage level OV_Reset is lower than the set voltage level OV_Set. When the feedback voltage is below the reset voltage level, the method 200 disables the clamped gate drive signal and discharges the power switch gate terminal (214). The method 200 then enables the normal gate drive circuit (216) and the method returns to monitor the feedback voltage indicative of the voltage across the power switch during an off-period of the power switch (202).

In some embodiments, in parallel with monitoring the feedback voltage to determine if the feedback voltage has decreased below a reset voltage level OV_Reset (212), the method 200 also monitor a time duration for which the power switch has been turned on using the clamped gate drive signal. More specifically, the method 200 monitors the on-duration of the power switch to determine if the on-duration has reached or exceeded a maximum duration (220). At the expiration of the maximum duration, also referred to as the one-shot duration, the method 200 proceeds to turn off the clamped gate drive signal (214) even if the feedback voltage has not fallen below the reset voltage level OV_Reset. The method 200 continues by enabling the normal gate drive circuit (216) and the method returns to monitor the feedback voltage indicative of the voltage across the power switch during an off-period of the power switch (202).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A controller circuit for generating a gate drive signal on an output node of the controller circuit for driving a gate terminal of a power switch where the gate terminal controls the current flow between first and second power terminals of the power switch, the controller circuit comprising:
    a first gate drive circuit configured to receive an input control signal and to generate a first output signal as the gate drive signal to drive the gate terminal of the power switch to fully turn on and off the power switch responsive to the input control signal, the first output signal having a first gate voltage value to drive the gate terminal of the power switch to fully turn on the power switch;
    a protection circuit configured to receive a first voltage indicative of a voltage at a first power terminal of the power switch and to generate a fault detection indicator signal, the protection circuit asserting the fault detection indicator signal in response to the first voltage exceeding a predetermined voltage level;
    a second gate drive circuit configured to receive the fault detection indicator signal and to generate a second output signal as the gate drive signal to drive the gate terminal of the power switch responsive to the fault detection indicator signal, the second gate drive circuit comprising an impedance divider circuit having an output terminal coupled to the output node of the controller circuit to generate the second output signal having a slow assertion transition and having a peak voltage value being clamped at a second gate voltage value being a voltage value above a threshold voltage of the power switching device and less than the first gate voltage value,
    wherein while the power switch is in an off state in response to the input control signal and in response to the fault detection indicator signal being asserted, the second gate drive circuit asserts the second output signal to turn on the power switch at the second gate voltage value for a predetermined time duration.

2. The controller circuit of claim 1, wherein the protection circuit comprises a hysteresis over-voltage detection circuit having a set voltage level and a reset voltage level, the set voltage level being higher than the reset voltage level, the hysteresis over-voltage detection circuit asserting the fault detection indicator signal in response to the first voltage being at or above the set voltage level and deasserting the fault detection indicator signal in response to the first voltage being at or below the reset voltage level.

3. The controller circuit of claim 2, wherein in response to the hysteresis over-voltage detection circuit asserting the fault detection indicator signal, the second gate drive circuit asserts the second output signal after a first time period.

4. The controller circuit of claim 1, wherein the second gate drive circuit asserts the second output signal to turn on the power switch at the second gate voltage value in response to a shorter time duration of the fault detection indicator signal being asserted and a predetermined fixed time duration.

5. The controller circuit of claim 1, wherein the protection circuit is disabled in response to the input control signal being asserted to turn on the power switch and the protection circuit is enabled a second time period after the input control signal is deasserted to turn off the power switch.

6. The controller circuit of claim 1, wherein the first gate drive circuit is disabled in response to the fault detection indicator signal being asserted.

7. The controller circuit of claim 1, wherein:
    the first gate drive circuit comprises a first transistor, a first impedance, a second impedance and a second transistor connected in series between a positive power supply voltage and a ground voltage, a common node between the first impedance and the second impedance being the output node; and
    the second gate drive circuit comprises a third transistor, a third impedance, a fourth impedance and a fourth transistor connected in series between the positive power supply voltage and the ground voltage, a common node between the third impedance and the fourth impedance being the output node,
    wherein the first gate drive circuit turns on the first transistor and turns off the second transistor to assert the first output signal to fully turn on the power switch and the first gate drive circuit turns off the first transistor and turns on the second transistor to deassert the first output signal to fully turn off the power switch; and
    wherein in response to the fault detection indicator signal being asserted, the second gate drive circuit turns on the third transistor and the fourth transistor to assert the second output signal at the second gate voltage value to turn on the power switch.

8. The controller circuit of claim 7, wherein the second output signal has a slow assertion transition as a result of the third impedance and the fourth impedance forming the impedance divider in response to the third transistor and the fourth transistor being turned on.

9. The controller circuit of claim 7, wherein the second output signal is clamped at the second gate voltage value as a result of the third impedance and the fourth impedance forming the impedance divider in response to the third transistor and the fourth transistor being turned on, the second gate voltage value being a divided down voltage of the positive power supply voltage as a function of the third impedance and the fourth impedance.

10. The controller circuit of claim 7, wherein in response to the fault detection indicator signal being asserted, the first gate drive circuit turns off the second transistor and the second gate drive circuit turns on the third transistor and the fourth transistor.

11. The controller circuit of claim 10, wherein in response to the fault detection indicator signal being deasserted or the expiration of a fixed time duration, the second gate drive circuit turns off the third transistor and the fourth transistor, the fourth transistor being turned off a third time period after the third transistor is turned off.

12. The controller circuit of claim 11, wherein in response to the fourth transistor being turned off, the first gate drive circuit turns on the second transistor to drive the first output signal to a voltage level to keep the power switch turned off.

13. The controller circuit of claim 1, wherein the power switch comprises an insulated gate bipolar transistor (IGBT) device.

14. A method of generating a gate drive signal for driving a gate terminal of a power switch where the gate terminal controls the current flow between first and second power terminals of the power switch, the method comprising:
- monitoring a feedback voltage indicative of a voltage across the first and second power terminals of the power switch during an off-period of the power switch;
- determining the feedback voltage exceeding a first voltage level during the off-period of the power switch;
- in response to the determining, disabling a normal gate drive signal driving the gate terminal of the power switch to turn off the power switch during the off-duration;
- in response to the determining, enabling a protection gate drive signal;
- generating a clamped gate drive signal having a clamped gate drive voltage value and applying the clamped gate drive signal to turn on the power switch in response to the determining that the feedback voltage exceeds the first voltage level during the off-period of the power switch;
- monitoring the feedback voltage to determine if the feedback voltage has decreased below a second voltage level, the second voltage level being lower than the first voltage level;
- in response to the determining that the feedback voltage has decreased below the second voltage level, disabling the clamped gate drive signal and discharging the gate terminal of the power switch;
- enabling the normal gate drive signal; and
- continuing to monitor the feedback voltage indicative of the voltage across the first and second power terminals of the power switch during the off-period of the power switch.

15. The method of claim 14, further comprising:
- determining the clamped gate drive signal has been enabled for a first time duration;
- in response to the determining, disabling the clamped gate drive signal and discharging the gate terminal of the power switch.

* * * * *